(12) United States Patent
Chen et al.

(10) Patent No.: US 7,061,084 B2
(45) Date of Patent: Jun. 13, 2006

(54) LEAD-BOND TYPE CHIP PACKAGE AND MANUFACTURING METHOD THEREOF

(75) Inventors: Kun-Ching Chen, Tainan (TW); Yung I Yeh, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/655,296

(22) Filed: Sep. 5, 2003

(65) Prior Publication Data

US 2004/0051169 A1    Mar. 18, 2004

Related U.S. Application Data

(62) Division of application No. 10/195,375, filed on Jul. 16, 2002, now Pat. No. 6,642,612, which is a division of application No. 09/514,645, filed on Feb. 29, 2000, now Pat. No. 6,423,622.

(51) Int. Cl.
*H01L 23/06* (2006.01)
(52) U.S. Cl. ............... 257/684; 257/707; 257/706; 257/701; 257/688; 257/694; 257/719; 257/700; 257/737
(58) Field of Classification Search ............ 257/706, 257/707, 688, 694, 719, 700, 701, 737, 684
See application file for complete search history.

(56) References Cited

U.S. PATENT DOCUMENTS

| | | | |
|---|---|---|---|
| 5,153,987 A | 10/1992 | Takahashi et al. | |
| 5,235,139 A | 8/1993 | Bengston et al. | |
| 5,258,094 A | 11/1993 | Furui et al. | |
| 5,528,461 A * | 6/1996 | Gore et al. | 361/760 |
| 5,548,099 A | 8/1996 | Cole, Jr. et al. | |
| 5,670,262 A * | 9/1997 | Dalman | 428/458 |
| 5,843,806 A | 12/1998 | Tsai | |
| 5,872,338 A * | 2/1999 | Lan et al. | 174/255 |
| 5,900,676 A | 5/1999 | Kweon et al. | |
| 5,945,258 A | 8/1999 | Shimizu et al. | |
| 5,948,280 A | 9/1999 | Namgung | |
| 6,204,559 B1 | 3/2001 | Lin et al. | |
| 6,238,952 B1 | 5/2001 | Lin | |
| 6,239,384 B1 | 5/2001 | Smith et al. | |
| 6,249,052 B1 * | 6/2001 | Lin | 257/737 |
| 2003/0069331 A1 * | 4/2003 | Teiichi et al. | 523/176 |

* cited by examiner

*Primary Examiner*—Eddie Lee
*Assistant Examiner*—Junghwa Im

(57) ABSTRACT

A lead-bond type chip package includes a multilayer substrate for supporting and electrical interconnecting a semiconductor chip. The multilayer substrate has a slot defined therein. The multilayer substrate comprises an interlayer circuit board having prepregs disposed thereon, a plurality of leads on the prepreg on the upper surface of the interlayer circuit board, and a plurality of solder pads for making external electrical connection on the prepreg on the lower surface of the interlayer circuit board. The leads of the multilayer substrate are bonded to corresponding bonding pads formed on the semiconductor chip. A package body is formed on the multilayer substrate around the semiconductor chip and in the slot of the multilayer substrate. The multilayer substrate is capable of providing a power or ground plane formed therein for enhancing the electrical performance of the package, and providing a high wiring density for packaging a chip with high I/O connections. This invention also provides a method of producing a multilayer substrate for use in forming a lead-bond type chip package

18 Claims, 7 Drawing Sheets

LEAD-BOND TYPE CHIP PACKAGE AND MANUFACTURING METHOD THEREOF

This application is a divisional of U.S. Patent Application No. 10/195,375 filed Jul. 16, 2002, now U.S. Pat. No. 6,642,612 which is a Divisional of U.S. Patent Application No. 09/514,645, filed Feb. 29, 2000, now U.S. Pat. No. 6,423,622.

BACKGROUND OF THE INVENTION

1. Field of the Invention

This invention relates to a lead-bond type chip package, and more specifically to a multilayer substrate for use in forming the lead-bond type chip package. This invention also pertains to a method for making the multilayer substrate.

2. Description of the Related Art

FIG. 1 depicts a conventional lead-bond type chip package 100 comprising a semiconductor chip 130 disposed on a substrate 120 through an elastomer pad 110. The semiconductor chip 130 has a plurality of bonding pads 132 disposed thereon. The substrate 120 includes a plurality of solder pads 122 and leads 124 provided on the upper surface thereof. The solder pads 122 are electrically connected to corresponding leads 124 through conductive traces on the substrate 120. The substrate 120 has a plurality of through-holes corresponding to the solder pads 122 such that each of the solder pads 122 has at least a portion exposed from its corresponding through-hole for mounting a solder ball 126. The leads 124 are bonded to corresponding bonding pads 132 thereby electrically connecting the semiconductor chip 130 to the substrate 120. A package body 140 is formed around the semiconductor chip 130 and filled the slot 120a of the substrate 120. The package body 140 is formed from insulating material such as epoxy resin.

The substrate 120 is typically made from flexible polyimide film; hence, it is prone to be deformed by external forces (e.g. stress due to CTE (coefficient of thermal expansion) mismatch) thereby resulting in problems of die cracking or delamination. Further, since the substrate 120 only has a layer of conductor circuit (i.e. the solder pads 122, the leads 124, and the conductive traces), it is difficult to provide enough power and ground planes. Therefore, the conventional lead-bond type chip package 100 does not provide a good signal plane for current surges into or out of the semiconductor chip 130. The relatively poor electrical performance associated with the package 100 is especially apparent when the semiconductor chip 130 includes high density, high frequency digital circuitry.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial number of I/O connections. Therefore, it will possibly happen that some of the I/O connections of a chip can not be lead-bonded for electrical connection due to the insufficiency of wiring density in the substrate with a single layer of conductor circuit. If this were the case, multiple layer structure will be required for the chip with high I/O connections.

The present invention therefore seeks to provide a lead-bond type chip package which overcomes, or at least reduces the above-mentioned problems of the prior art.

SUMMARY OF THE INVENTION

It is a primary object of the present invention to provide a lead-bond type chip package comprising a multilayer substrate capable of providing enough power and ground planes thereby enhancing the electrical performance of the package.

It is another object of the present invention to provide a lead-bond type chip package comprising a multilayer substrate with enhanced mechanical strength thereby reducing problems of die cracking or delamination.

Accordingly, in a first aspect, the present invention provides a lead-bond type chip package including a multilayer substrate for supporting and electrical interconnecting a semiconductor chip. The multilayer substrate has a slot defined therein. The multilayer substrate comprises an interlayer circuit board having a dielectric layer formed thereon, a plurality of leads on the dielectric layer on the upper surface of the interlayer circuit board, and a plurality of solder pads for making external electrical connection disposed on the dielectric layer on the lower surface of the interlayer circuit board. The solder pads are electrically connected to corresponding leads. The interlayer circuit board has conductor circuits formed therein. The leads of the multilayer substrate are bonded to corresponding bonding pads formed on the semiconductor chip. A package body is formed on the multilayer substrate around the semiconductor chip and in the slot of the multilayer substrate.

Preferably, the interlayer circuit board is formed from a core layer made of fiberglass reinforced BT (bismaleimide-triazine) resin or FR-4 fiberglass reinforced epoxy resin thereby increasing the mechanical strength of the multilayer substrate. The interlayer circuit board comprises at least a ground plane (or a power plane) formed therein for enhancing the electrical performance of the lead-bond type chip package. Moreover, the dielectric layer on the interlayer circuit board is preferably formed from prepreg which comprises a semi-cured thermosetting resin as well as glass fibers dispersed therein whereby the mechanical strength of the multilayer substrate is further increased.

According to a second aspect, this invention further provides a method of producing a multilayer substrate for use in forming a lead-bond type chip package comprising the steps of (a) providing an interlayer circuit board in which conductor circuits have been formed, the interlayer circuit board having a dielectric layer formed thereon and a slot defined therein; (b) providing a first copper foil with one surface coated by a etch-resistant layer; (c) laminating on one surface of the interlayer circuit board the first copper foil, and the other surface of the interlayer circuit board a second copper foil in a manner that the etch-resistant coated surface of the first copper foil is in contact with the dielectric layer on the interlayer circuit board; (d) selectively etching the copper foils laminated on the interlayer circuit board so as to form fine holes at predetermined positions thereof; (e) applying laser beams to the prepreg exposed from the fine holes of the copper foils so as to form via holes and expose parts of the conductor circuits of the interlayer circuit board; (f) forming through-holes; (g) plating a metal layer to electrically connect the conductor circuits of the interlayer circuit board and the copper foils; (h) selectively etching the first copper foil and the plated metal layer thereon to form a plurality of leads adapted for electrically connecting to a semiconductor chip wherein each of the leads has at least a portion across the slot of the interlayer circuit board, and selectively etching the second copper foil and the plated metal layer thereon to form a predetermined configuration and expose the slot of the interlayer circuit board; (i) stripping the etch-resistant coated on the first copper foil exposed within the slot of the interlayer circuit board; (j) forming a solder mask on the patterned surfaces of the multilayer substrate in a manner that areas on the leads for electrically connecting to a semiconductor chip and solder pads for making external electrical connection are exposed from the solder mask; and (k) forming a metal coating on the solder pads and the exposed portions of the leads. In a preferred embodiment, the step of(a), (b), and (c) described above can be replaced by (a') providing an interlayer circuit board in which conductor circuits have been formed, the interlayer circuit board having a slot defined therein; (b') providing a first copper foil with one surface coated by an etch-resistant laver and (c') laminating on one surface of the interlayer circuit board the first copper foil, and the other surface of the interlayer circuit board a second copper foil via a plurality of prepregs wherein the etch-resistant coated surface of the first copper foil is in contact with one of the prepreg, and each prepreg has a slot corresponding to the slot of the interlayer circuit board.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 9:
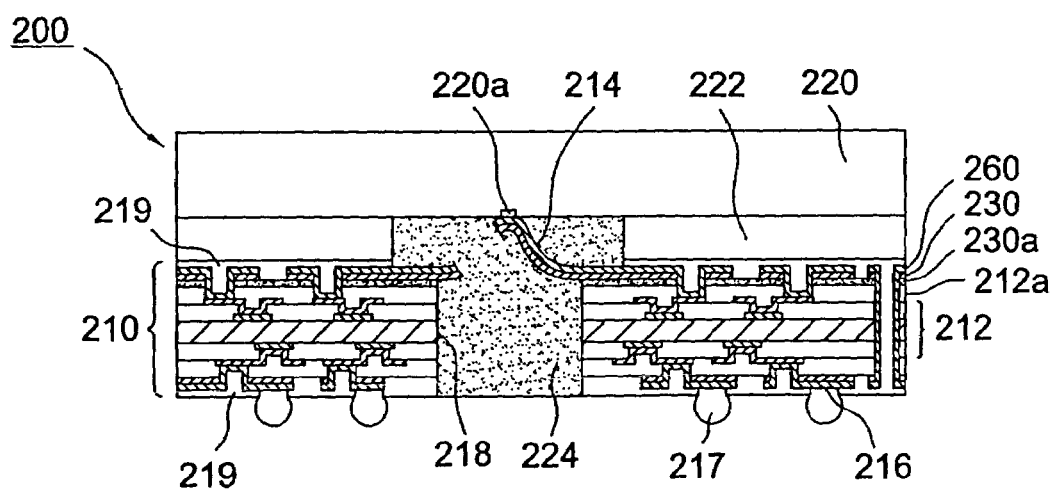
FIG. 9 is a cross-sectional view of a portion of a lead-bond type chip package according to a first embodiment of the present invention.
Figure 9A:
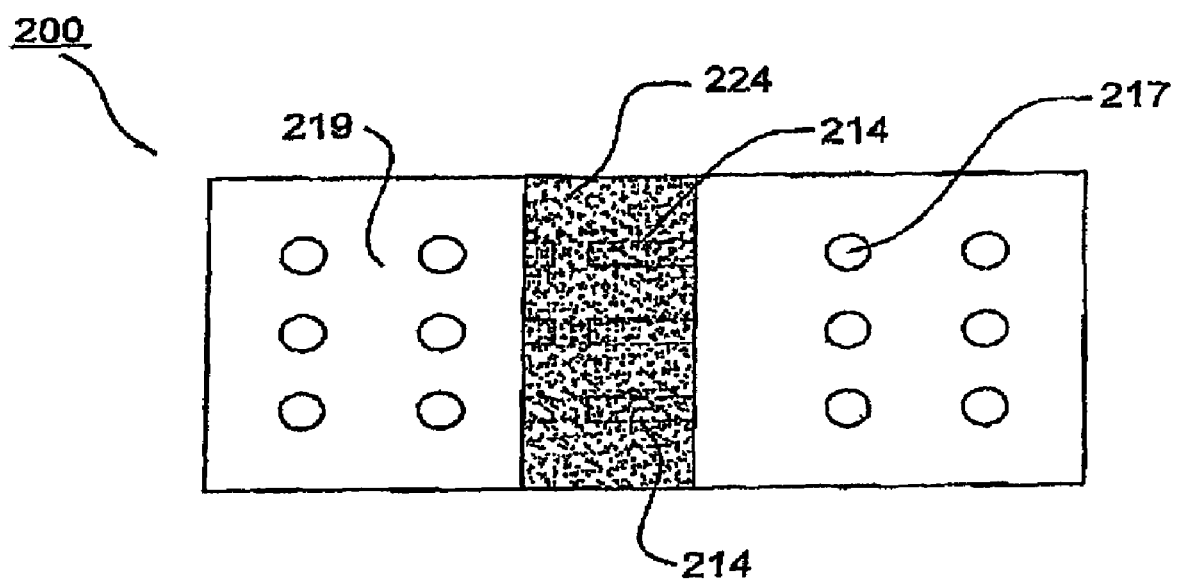
FIG. 9a is a bottom plan view of FIG. 9.

FIGS. 9 and 9a discloses a partial portion of a lead-bond type chip package 200 in accordance with a first embodiment of the present invention. The chip package 200 comprises a multilayer substrate 210 for supporting and electrical interconnecting a semiconductor chip 220. The multilayer substrate 210 mainly comprises an interlayer circuit board 212, a dielectric layer 212a on the interlayer circuit board 212, a plurality of leads 214 on the dielectric layer 212a on the upper surface of the interlayer circuit board 212, and a plurality of solder pads 216 for making external electrical connection disposed on the dielectric layer 212a on the lower surface of the interlayer circuit board 212. The solder pads 216 are electrically connected to corresponding leads 214. The interlayer circuit board 212 has conductor circuits formed therein. The multilayer substrate 210 has a slot 218 defined therein. The leads 214 of the multilayer substrate are directly bonded to corresponding bonding pads 220a formed on the semiconductor chip 220. A package body 224 is formed on the multilayer substrate 210 around the semiconductor chip 220 (not shown) and in the slot 218 of the multilayer substrate 210. Each of the solder pads 216 is provided with a solder ball 217.

Preferably, the multilayer substrate 210 comprises a solder mask 219 formed thereon wherein areas on the leads 214 for electrically connecting to the semiconductor chip 220 and the solder pads 216 are exposed from the solder mask 219. And the solder pads 216 and the exposed portions of the leads 214 are provided with a metal coating (not shown) formed thereon. The metal coating on the leads 214 allows a good bond to be formed with the bonding pads 220a of the semiconductor chip 220. The metal coating typically comprises a layer of nickel covering the solder pads 216 and the exposed portions of the leads 214, and a layer of gold (or palladium) covering the nickel layer. The metal coating prevents the solder pads 216 from corrosion and contamination thereby assuring the solder joint reliability thereof.

The lead-bond type chip package 200 is mounted onto a substrate such as a printed circuit board through the solder balls 217 that electrically interconnect the package 200 and the substrate. Preferably, the interlayer circuit board 212 comprises at least a ground plane or a power plane (not shown) formed therein. Therefore, the source voltage and ground potential can be supplied in any desired positions through the ground plane and the power plane, so it is possible to shorten the source voltage or ground potential feed lines to suppress power source noises and attain speed-up of the operation of the chip.

FIGS. 2–8 show a method of making a multilayer substrate for use in forming the lead-bond type chip package 200 of the present invention.

Figure 1:
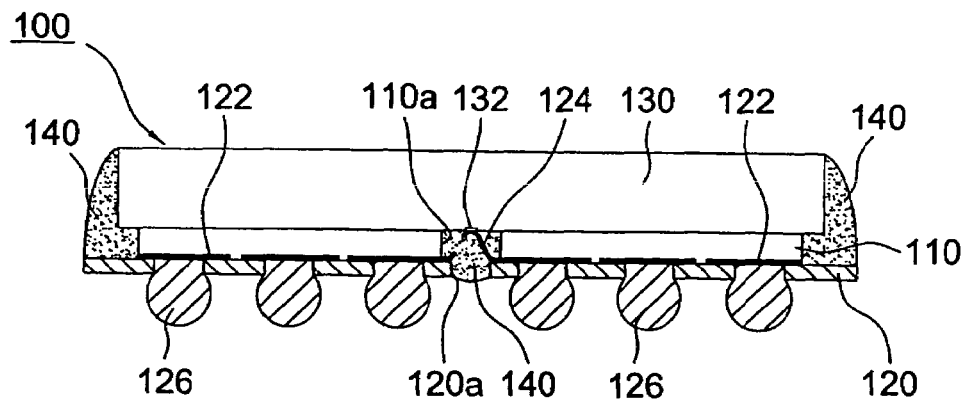
FIG. 1 is a cross-sectional view of a conventional lead-bond type chip package.
Figure 2:
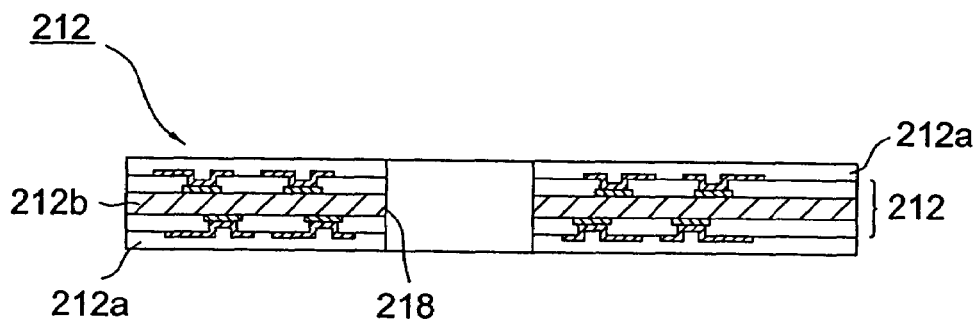
FIGS. 2–8 illustrate a method of making a multilayer substrate for use in forming a lead-bond type chip package in accordance with a first embodiment of the present invention.

FIG. 2 illustrates the interlayer circuit board 212 with a dielectric layer 212a formed thereon. Though only four layers of conductor circuits of the interlayer circuit board 212 are shown in this preferred embodiment, a interlayer circuit board for use with the invention can include any number of layers of conductor circuits if desired. The slot 218 can be formed by any of a number of well-known techniques including mechanical drilling or laser drilling. Preferably, the interlayer circuit board 212 can be formed by any of a number of build-up technologies. And the interlayer circuit board 212 is formed from a core layer 212b made of fiberglass reinforced BT (bismaleimide-triazine) resin or FR-4 fiberglass reinforced epoxy resin thereby increasing the mechanical strength of the multilayer substrate. Alternatively, the interlayer circuit board 212 may be a multi-layer ceramic substrate.

Figure 3:
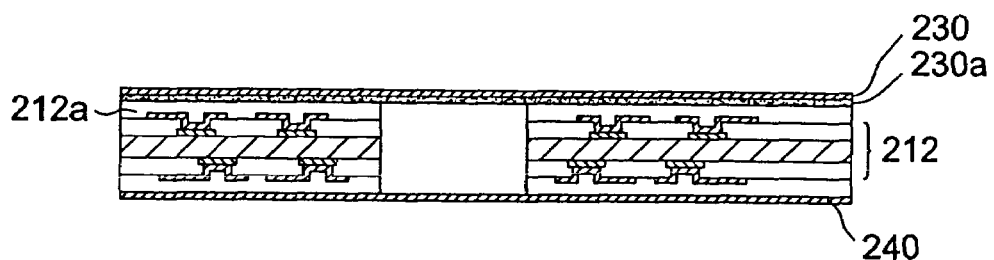

Referring to FIG. 3, a copper foil 230 with one surface coated by a etch-resistant layer 230a and a copper foil 240 are laminated on the interlayer circuit board 212 by conventional methods such as thermocompression. It is noted that the etch-resistant coated surface of the copper foil 230 is in contact with the dielectric layer 212a on the interlayer circuit board 212.

Figure 4:
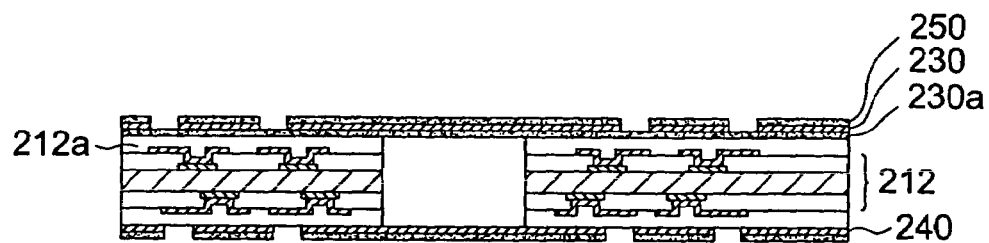

Referring to FIG. 4, a photoresist layer 250 is formed over the surface of the copper foils 230, 240 laminated in the interlayer circuit board 212 using conventional techniques and materials, then imaged and developed. As is well-known, a photomask is used to image only certain area of the photoresist layer which, when developed, are removed to leave predetermined portions of the coppers foil 230, 240 exposed. Then the exposed portions of the copper foils 230, 240 are etched so as to form fine holes at predetermined positions thereof.

Figure 5:
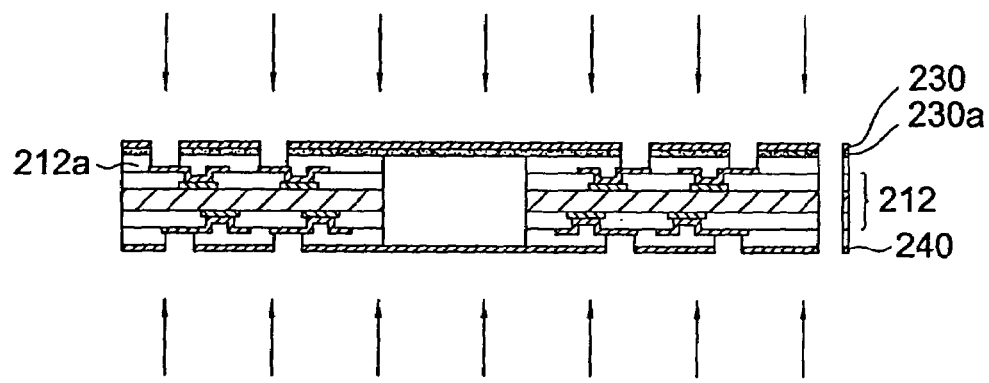

Referring to FIG. 5, the remaining photoresist is removed and laser beams are applied to the dielectric layer 212a exposed from the fine holes of the copper foils 230, 240. The laser beams is used to remove the exposed dielectric layer 212a until parts of the conductor circuits of the interlayer circuit board 212 are exposed thereby forming via holes. Subsequently, through-holes are formed by means of mechanical drilling or laser drilling (for simplicity, only one through-hole is shown).

The types of laser usable in this step include carbon dioxide laser, YAG laser, excimer laser, etc., of which carbon dioxide laser is preferred in view of productivity.

Figure 6:
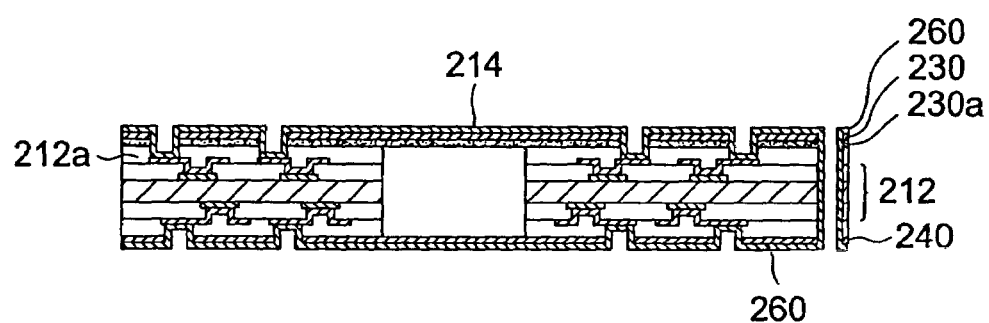

Referring to FIG. 6, a metal layer such as a copper layer 260 is plated for electrically connecting the conductor circuits of the interlayer circuit board 212 to the copper foils 230, 240. Plating in this step is carried out by using the same technique as usually employed for through-hole plating of printed circuit boards, e.g., electroless copper plating. The copper layer 260 establishes electrical connections between the copper foils 230, 240, via holes, through-holes-and the conductor circuits of the interlayer circuit board 212.

Figure 7:
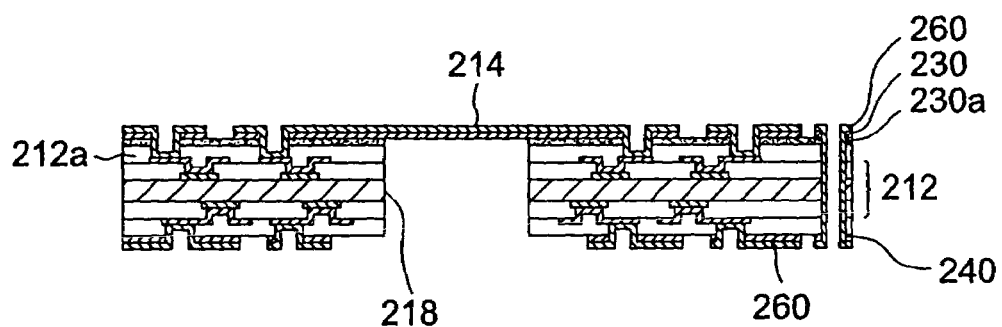

Referring to FIG. 7, the copper foils 230, 240 and the copper layer 260 thereon are selectively etched to form outer layer circuits by using conventional techniques described above. It is noted that leads 214 adapted for electrically connecting to a semiconductor chip are also formed in this step wherein each of the leads 214 has at least a portion across the slot 218. The purpose of the etch-resistant layer 230a is to prevent the backside surfaces of leads 214 across the slot 218 from etching in this step. Further, the copper foil 240 and copper layer 260 thereon are selectively etched to expose the slot 218 from the bottom of the multilayer substrate.

Figure 8:
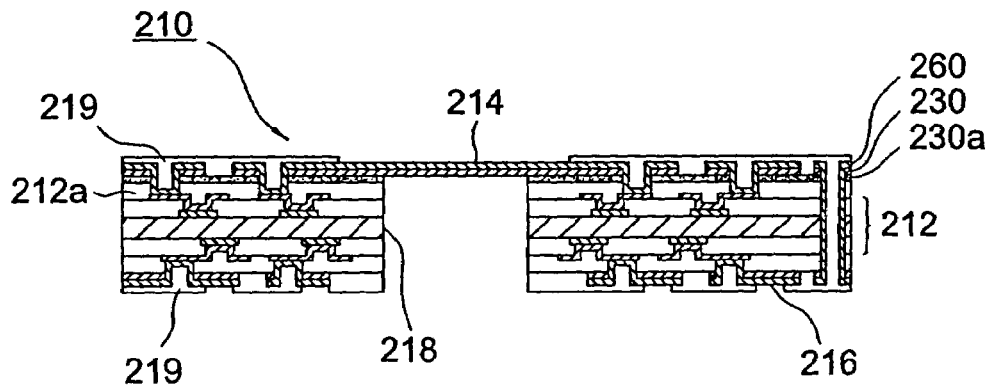

Referring to FIG. 8, the etch-resistant 230a on the copper foil 230 exposed within the slot 218 is stripped, and then a solder mask 219 such as photoimagable solder mask or dry film solder mask is formed over the patterned surfaces of the multilayer substrate, then imaged and developed. A photomask is used to image only certain area of the solder mask which, when developed, are removed to leave predetermined areas exposed, e.g., areas on the leads 214 for electrically connecting to a semiconductor chip and solder pads 216 for making external electrical connection.

Then, a metal coating (not shown) is formed on the exposed areas on the solder pads 216 and the exposed portions of the leads 214 by using conventional plating techniques. Since the metal coating is also formed on the leads 214 for electrical connecting to the chip 220, the metal coating should be formed of materials that allow a good bond to the conventional bonding wire. Preferably, the metal coating comprises a layer of nickel covering the solder pads 216 and the exposed portions of the leads 214, and a layer of gold (or palladium) covering the nickel layer.

Referring to FIG. 9 again, the semiconductor chip 220 is attached onto the multilayer substrate 210 through an elastomer pad 222. Then a bonding tool moves one end of each lead 214 down to the bonding pad 220a on the semiconductor chip 220 and bonds the lead 214 thermosonically. Finally, a package body 224 is formed on the multilayer substrate 210 around the semiconductor chip 220 (not shown) and in the slot 218 of the multilayer substrate 210 by using a dipsensing system.

Figure 17:
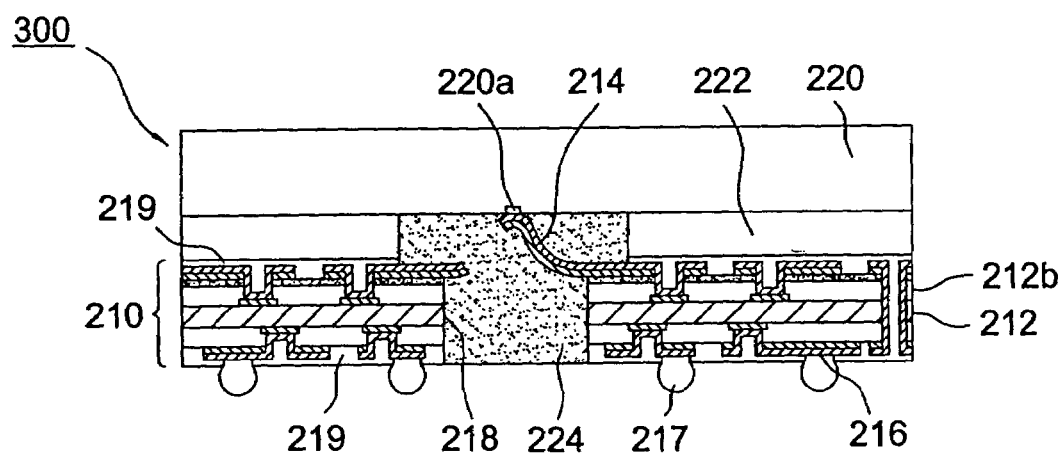
FIG. 17 is a cross-sectional view of a portion of a lead-bond type chip package according to a second embodiment of the present invention.

FIG. 17 discloses a portion of a lead-bond type chip package 300 in accordance with a second embodiment of the present invention. The chip package 300 is substantially identical to the chip package 200 of FIG. 9 with exception that the prepregs 212b are used in place of the dielectric layer 212a on the interlayer circuit board.

FIGS. 10–16 show a method of making a multilayer substrate for use in forming the lead-bond type chip package 300 of the present invention.

Figure 10:
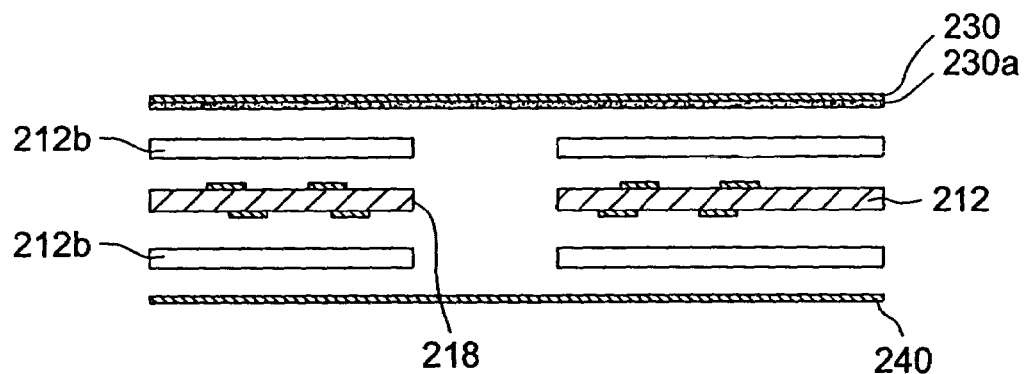
FIGS. 10–16 illustrate a method of making a multilayer substrate for use in forming a lead-bond type chip package in accordance with a second embodiment of the present invention.

Referring to FIG. 10, the interlayer circuit board 212, a pair of prepregs 212b having slots defined therein, a copper foil 230 with one surface coated by an etch-resistant layer 230a, and a copper foil 240 are illustrated. Though only two layers of conductor circuits of the 30 interlayer circuit board 212 are shown in this preferred embodiment, a interlayer circuit board for use with the invention can include any number of layers of conductor circuits if desired. The slot 218 can be formed by any of a number of well-known techniques including mechanical drilling or laser drilling. The prepregs 212b comprise a semi-cured thermosetting resin (B-stage condition) as well as glass fibers dispersed therein whereby the mechanical strength of the multilayer substrate is further increased.

Figure 11:
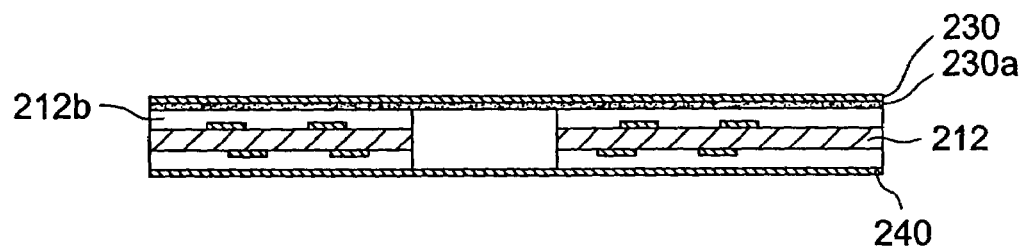

Referring to FIG. 11, the copper foil 230 and the copper foil 240 are laminated on the interlayer circuit board 212 via the prepregs 212b by conventional methods such as thermocompression. It is noted that the etch-resistant coated surface of the copper foil 230 is in contact with the one of the prepreg 212b, and the slot of each prepreg 212b is corresponding to the slot 218 of the interlayer circuit board.

Figure 12:
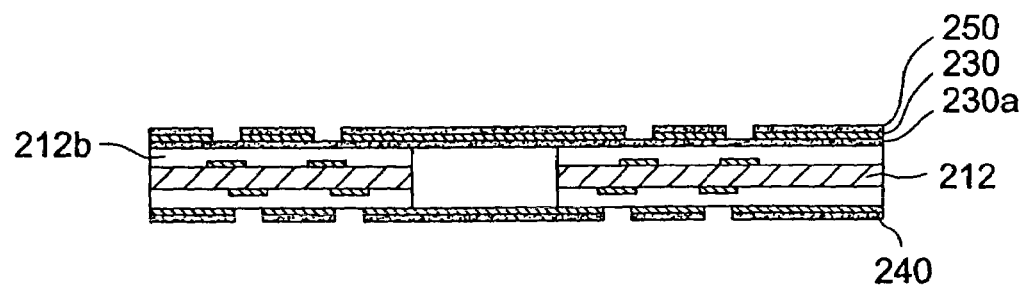

Referring to FIG. 12, a photoresist layer 250 is formed over the surface of the copper foils 230, 240 using conventional techniques and materials, then imaged and developed. Then the exposed portions of the copper foils 230, 240 are etched so as to form fine holes at predetermined positions thereof.

Figure 13:
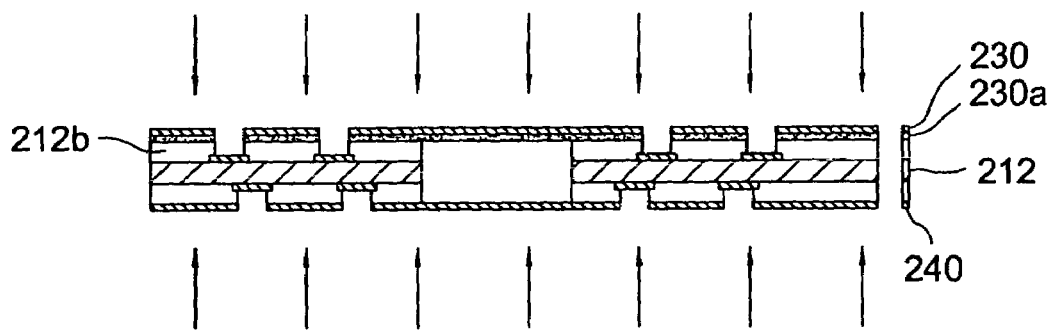

Referring to FIG. 13, the remaining photoresist is removed and laser beams are applied to the prepreg 212b exposed from the fine holes of the copper foils 230, 240. The laser beams is used to remove the exposed prepreg 212b until parts of the conductor circuits of the interlayer circuit board 212 are exposed thereby forming via holes. Subsequently, through-holes are formed by means of mechanical drilling or laser drilling (for simplicity, only one through-hole is shown).

Figure 14:
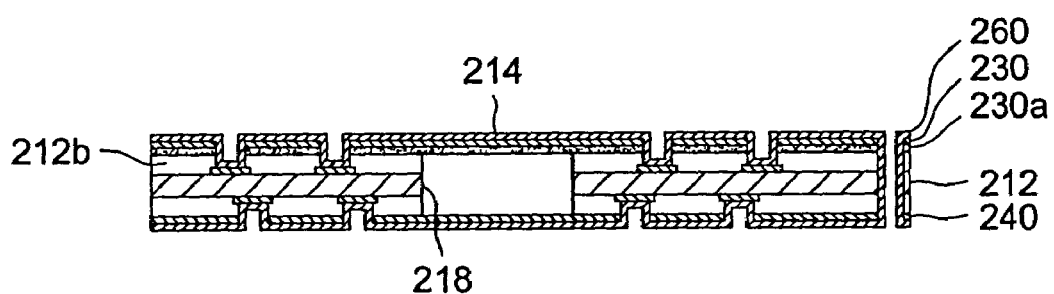

Referring to FIG. 14, a metal layer such as a copper layer 260 is plated for electrically connecting the conductor circuits of the interlayer circuit board 212 to the copper foils 230, 240.

Figure 15:
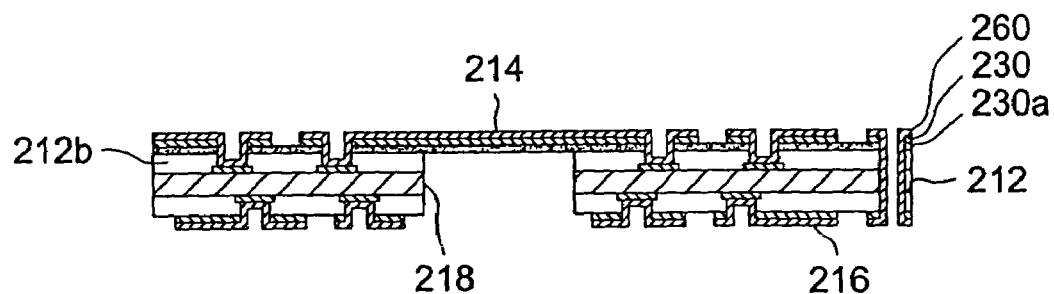

Referring to FIG. 15, the copper foils 230, 240 and the copper layer 260 thereon are selectively etched to form outer layer circuits by using conventional techniques described above. It is noted that leads 214 adapted for electrically connecting to a semiconductor chip are also formed in this step wherein each of the leads 214 has at least a portion across the slot 218. Further, the copper foil 240 and copper layer 260 are selectively etched to expose the slot 218 from the bottom of the multilayer substrate.

Figure 16:
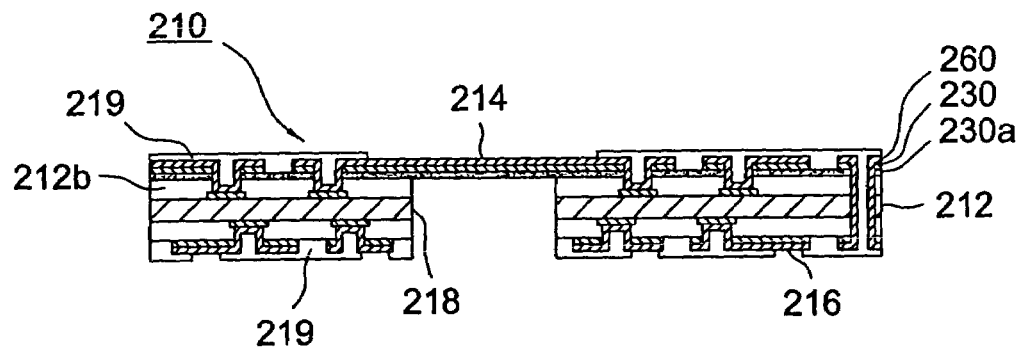

Referring to FIG. 16, the etch-resistant 230a on the copper foil 230 exposed within the slot 218 is stripped, and then a solder mask 219 such as photoimagable solder mask or dry film solder mask is formed over the patterned surfaces of the multilayer substrate, then imaged and developed.

Then, a metal coating (not shown) is formed on the exposed areas on the solder pads 216 and the exposed portions of the leads 214 by using conventional plating techniques.

Referring to FIG. 17 again, the semiconductor chip 220 is attached onto the multilayer substrate 210 through an elastomer pad 222. Then a bonding tool moves one end of each lead 214 down to the bonding pad 220a on the semiconductor chip 220 and bonds the lead 214 thermosonically. Finally, a package body 224 is formed on the multilayer substrate 210 around the semiconductor chip 220 (not shown) and in the slot 218 of the multilayer substrate 210 by using a dipsensing system.

The present invention provides a novel multilayer substrate adapted for use in forming a lead-bond type chip package. The multilayer substrate is capable of providing a closer power or ground plane than is provided by the underlying system PCB (printed circuit board) power or ground plane. The presence of this closer power or ground plane enhances the electrical performance of the lead-bond type chip package. The multilayer substrate also can provide a high wiring density for packaging a chip with high I/O connections. Moreover, the mechanical strength of the multilayer substrate can be further increased by the prepregs disposed therein, since each prepreg comprises glass fibers impregnated with thermosetting resin.

Although the invention has been explained in relation to its preferred embodiment, it is to be understood that many other possible modifications and variations can be made without departing from the spirit and scope of the invention as hereinafter claimed.

What is claimed is:

1. A multilayer substrate for use in forming a lead-bond type chip package, the multilayer substrate comprising:
    an interlayer circuit board having opposing upper and lower surfaces, said interlayer circuit. board further having conductor circuits formed therein and a slot extending therethrough;
    an upper dielectric layer on the upper surface of the interlayer circuit board;
    a plurality of leads on the upper dielectric layer wherein the leads extend integrally from one of the conductor circuits and are adapted for electrically connecting to a semiconductor chip, and each of the leads has at least a portion extending across the slot of the interlayer circuit board;
    a lower dielectric layer on the lower surface of the interlayer circuit board;
    a plurality of solder pads for making external electrical connection disposed on the lower dielectric layer, wherein the solder pads are electrically connected to the corresponding leads;
    a solder mask on an upper surface of the multilayer substrate wherein bonding areas on the leads for electrically connecting to a semiconductor chip and the solder pads are exposed from the solder mask; and
    a metal coating on the solder pads and the exposed portions of the leads.

2. The multilayer substrate as claimed in claim 1, wherein the dielectric layer on the interlayer circuit board is formed from prepreg.

3. The multilayer substrate as claimed in claim 1, further comprising a ground plane for supplying ground potential.

4. The multilayer substrate as claimed in claim 1, further comprising a power plane for supplying the source voltage.

5. The multilayer substrate as claimed in claim 1, wherein the interlayer circuit board is formed from fiberglass reinforced BT (bismaleimide-triazine) resin.

6. The multilayer substrate as claimed in claim 1, wherein the interlayer circuit board is formed from FR-4 fiberglass reinforced epoxy resin.

7. The multilayer substrate as claimed in claim 1, wherein the interlayer circuit board is formed from ceramic materials.

8. The multilayer substrate as claimed in claim 1, wherein the metal coating comprises a layer of nickel covering the solder pads and the exposed portions of the leads, and a layer of metal selected from the group consisted of gold and palladium covering the nickel layer.

9. A multilayer substrate for use in forming a lead-bond type chip package, the multilayer substrate having upper and lower surfaces and a slot extending from the lower surface toward the upper surface, the multilayer substrate further comprising:
    an interlayer circuit board having conductor circuits formed therein,
    a plurality of leads extending integrally from one of the conductor circuits and being formed on top the interlayer circuit board, and
    a plurality of solder pads disposed under the interlayer circuit board, wherein the solder pads are electrically connected to the corresponding leads by a plurality of conductive traces and at least one through hole extending from the upper surface of the multilayer substrate to the lower surface of the multilayer substrate.

10. The multilayer substrate of claim 9, wherein said slot extends through an entirety of said interlayer circuit board.

11. The multilayer substrate of claim 9, wherein said leads are exposed in the slot and are accessible from outside via an opening of said slot on the lower surface of the multilayer substrate.

12. The multilayer substrate of claim 9, wherein said leads and said slot together define a cavity having an opening on the lower surface of the multilayer substrate and a bottom defined by said leads.

13. The multilayer substrate as claimed in claim 9, further comprising a ground plane for supplying ground potential.

14. The multilayer substrate as claimed in claim 9, further comprising a power plane for supplying the source voltage.

15. The multilayer substrate as claimed in claim 9, wherein the interlayer circuit board is formed from one selected from the group consisting of fiberglass reinforced BT (bismaleimide-triazine) resin and FR-4 fiberglass reinforced epoxy resin and ceramic materials.

16. The multilayer substrate of claim 1, wherein said slot extends through entireties of said interlayer circuit board, said upper dielectric layer and said lower dielectric layer.

17. The multilayer substrate of claim 16, wherein said leads are exposed in the slot and are accessible from outside via an opening of on the lower dielectric layer.

18. The multilayer substrate of claim 16, wherein said leads and said slot together define a cavity having an opening on the lower dielectric layer and a bottom defined by said leads.

* * * * *